United States Patent [19]
Burrer et al.

[11] Patent Number: 5,172,379
[45] Date of Patent: Dec. 15, 1992

[54] HIGH PERFORMANCE MEMORY SYSTEM

[75] Inventors: Charlotte A. Burrer, Newton; Lawrence L. Krantz, Marlborough, both of Mass.

[73] Assignee: Data General Corporation, Westboro, Mass.

[21] Appl. No.: 315,394

[22] Filed: Feb. 24, 1989

[51] Int. Cl.⁵ .............................................. G06F 11/10
[52] U.S. Cl. ................................... 371/37.1; 371/2.2; 371/39.1
[58] Field of Search ..................... 371/37.1, 37.3, 40.1, 371/40.2, 38.1, 39.1, 2.1, 2.2; 365/200

[56] References Cited

U.S. PATENT DOCUMENTS

| | | | |
|---|---|---|---|
| 4,335,458 | 6/1982 | Krol | 371/40.1 |
| 4,675,869 | 6/1987 | Driessen | 371/37.8 |
| 4,715,036 | 12/1987 | Oakes | 371/37.1 |
| 4,775,978 | 10/1988 | Hartness | 371/40.1 |
| 4,788,685 | 11/1988 | Sako | 371/40.1 X |
| 4,802,170 | 1/1989 | Trottier | 371/2.2 |

Primary Examiner—Robert W. Beausoliel
Attorney, Agent, or Firm—Sewall P. Bronstein; Robert F. O'Connell

[57] ABSTRACT

An improved memory system for use in a data processing system which memory system has two memory banks and corresponding error correction circuitry associated with each. Data words of a block thereof are stored in the memory banks in an interleaved fashion wherein alternating words are stored in one bank and intervening alternating words are stored in the other bank. During a write operation the memory is controlled so that the first data word of a block stored in a memory bank uses a late write technique and all subsequent data words thereof use an early write technique. During a read operation, pairs of data words are read and checked for errors simultaneously and are then supplied in a pipelined manner.

8 Claims, 4 Drawing Sheets

HIGH PERFORMANCE MEMORY SYSTEM

INTRODUCTION

This invention relates generally to memory systems for use in data processing systems and, more particularly, to memory systems which use multiple banks of memory modules and a unique interleaved, pipelined technique for accessing said memory banks when performing read and write operations.

BACKGROUND OF THE INVENTION

In general, when using multiple banks of memory modules in a memory system of a data processor, in order to access such memory banks to perform read and write operations, information which is being transferred to or from the memory system is often transferred in the form of multiple data word blocks. For example, it is common to transfer information in blocks of four 32-bit data words, either for writing into or reading from the memory modules. A conventional approach to such a data transfer operation is to utilize four banks of memory modules and to access one of the four words from each memory module bank in sequence. During each read access, for example, error detection and correction logic is utilized in association with each module bank in order to check the data words involved for single or multiple bit errors.

The overall performance for such a conventional approach is acceptable when using high speed memory systems, but at a cost which is commensurate with the number and the quality of the components which are used therein. It is desirable in some applications to achieve equivalent performance at a lower cost by using fewer components and lower speed memory modules than those required in current systems.

BRIEF SUMMARY OF THE INVENTION

In accordance with the invention, a memory comprising multiple memory banks is arranged to provide a different and unique combination of interleaving and pipelining of the data words in a block thereof such that a write uses both late write and early write operations in the same data transfer and a read from a memory bank is performed in a unique pipelined fashion. The combination of such interleaving and pipelining operations provides a performance capability which is comparable to present day systems and which can be achieved at a lower cost by the use of fewer components and a lower speed memory.

In accordance therewith, in a specific embodiment, for example, the memory system is arranged to include two memory banks, alternate data words of a block thereof being stored in a first memory bank and intervening alternate data words of the block being stored in a second memory bank for fast access of such a multiple data word block, e.g., a block of four data words. Data words of a sequence thereof which are being written into the memory banks, for example, are written in an alternating manner to each memory bank. Data words which are being accessed by a requestor, for example, in a read operation, are effectively pipelined and supplied to the requestor in alternating sequence.

For a write operation of a block of four data words, the first data word is written into one memory bank by a late write operation and the third word is written into the same memory bank by an early write operation, while the second data word is written into the other memory bank by a late operation and the fourth word is written into the same memory bank by an early write operation. Such operation can be extended to an eight word block, for example, by writing the first word into one memory bank by a late write operation and the third, fifth and seventh words by an early write operation, while writing the second word into the other memory bank by a late write operation and the fourth, sixth, and eighth words by an early write operation.

For a read operation the first two data words of a four word block thereof, for example, are accessed simultaneously, one from each memory bank, the two words then being simulataneously checked for errors. The first word from the first memory bank, which word has been checked for errors, is supplied to a suitable bus for supply to the requestor while the second word from the second memory bank is temporarily held for subsequent supply to the requestor. The next two words are simultaneously accessed one from each memory bank and are checked for errors and then supplied in a similar pipelined fashion to the requestor. For an eight word block, each subsequent pair thereof are also simultaneously accessed, checked for errors, and supplied in such pipelined fashion.

Thus, the data words of a four data word block are stored in the memory banks in an interleaved fashion so that the first and third data words thereof are stored in the first memory bank, while the second and fourth words are stored in the second memory bank. Appropriate receiver register and latching circuitry is used to pipeline the supplying thereof in the read operation so that the words are accessible and can be error checked and subsequently supplied in a pipelined manner to the suitable bus in the desired sequence.

Accordingly, a four word data block is made available by using only two memory banks and only two corresponding error checking logic circuits associated therewith, the four word data block becoming available in the desired correct sequence. The manner in which such words are interleaved in the memory banks and then pipelined for supply to a suitable bus, for example, provides a performance comparable to that of conventional systems mentioned above which utilize four memory banks and error checking logic associated with each, but the cost of the system in accordance with the invention is less than that of conventional systems.

By using the technique of the invention, for example, a memory having only two memory banks and associate error correction circuitry can operate as a 25 MHZ. system using 100 nanosec. DRAM memory banks to achieve a sustained data transfer rate of 40 Mbytes per second. Such performance is comparable to conventional systems using four memory banks comprising higher speed DRAMs.

DESCRIPTION OF THE INVENTION

The invention can be described in more detail with the help of the accompanying drawings wherein FIG. 1 shows a block diagram of an exemplary system in which the invention can be used;

Figure 1:
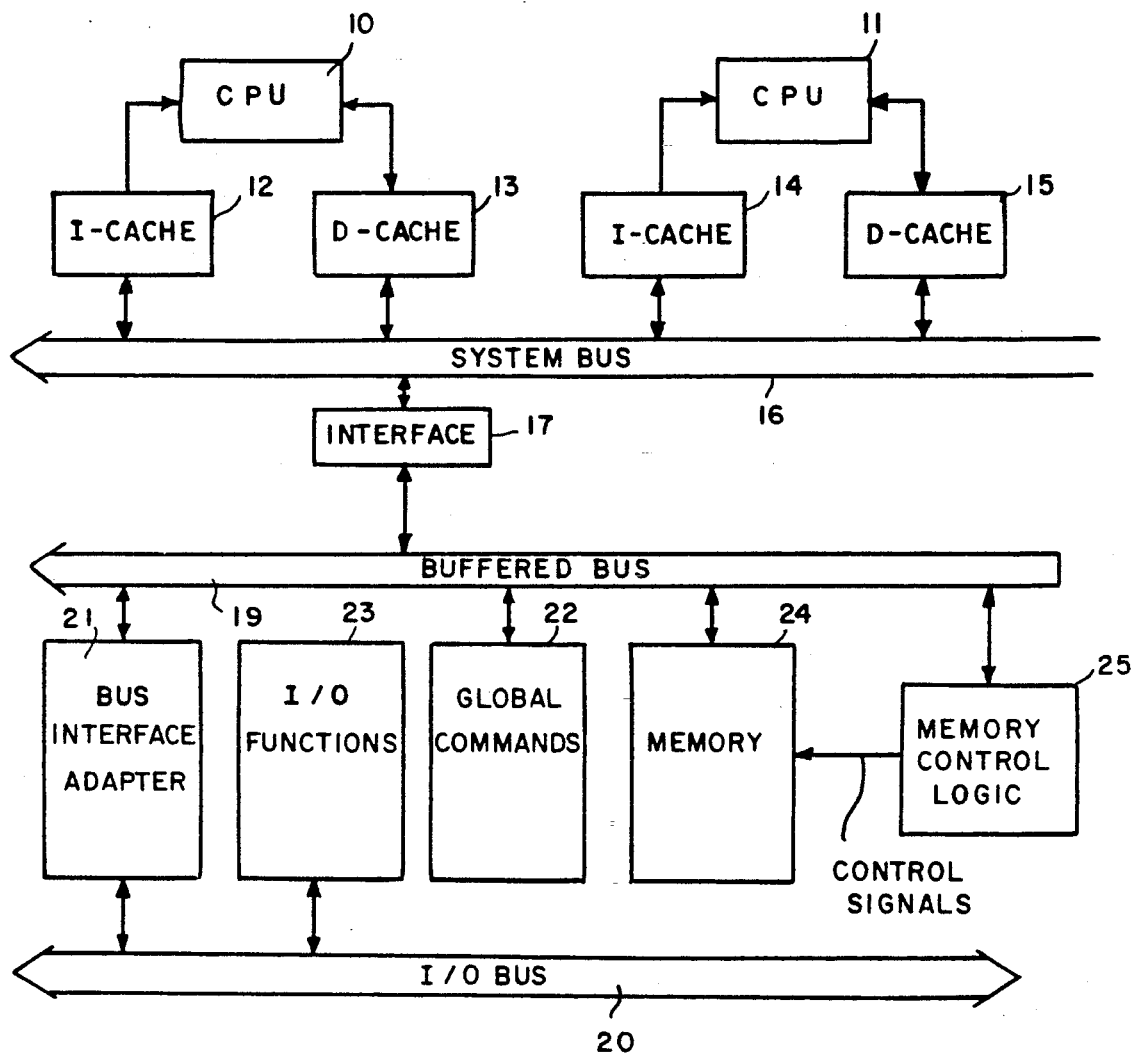

FIG. 1 shows a block diagram of an overall data processing system in which the invention can be used. Such system is generally of a relatively known architecture and, in the particular exemplary embodiment shown, comprises a pair of central processing units 10 and 11, each having associated with it a pair of cache memory units, e.g., cache units 12 and 13 associated with CPU 10 and cache units 14 and 15 associated with CPU 11. Cache units 12 and 14, for example, are instruction, cache units, while cache units 13 and 15 are data cache units, their functions being well known to those in the art.

The processor units communicate with the rest of the overall system via a system bus 16 which is multiplexed so as to carry both addresses and data. The system bus interfaces to a buffered bus 19, via an interface unit 17 so that information can be tranferred to and from the processor units to other units of the system. For example, information may be required for tranfer to and from an input/output (I/O) device by way of an I/O bus 20 via suitable system bus/I/O adapter logic 21. Appropriate I/O global command signals, for example, can be supplied via suitable global resource logic 22, such signals including, for example, various globally used clock signals as well as other appropriate command or control signals for use throughout the system. Appropriate I/O function logic 23 may also be available to the I/O bus for handling I/O interupts and bus arbitration operations, as well as other bus management signals. Units 21, 22 and 23 do not form a part of the invention, but are generally of the type available in systems known to the art and need not be described in further detail here.

The system utilizes a memory 24 comprising appropriate memory bank units, with associated error detection and correction logic, and suitable memory control logic 25 for providing control signals for controlling the operation of memory 24. Such memory units can be accessed by a processor or any other bus master for writing words into the memory or for reading data words therefrom via the system bus 16, an interface unit 17, and buffered bus 19, as shown. The organization of memory 24 and the use thereof in an interleaved, pipelined fashion in accordance with the invention is described below.

Figure 2:
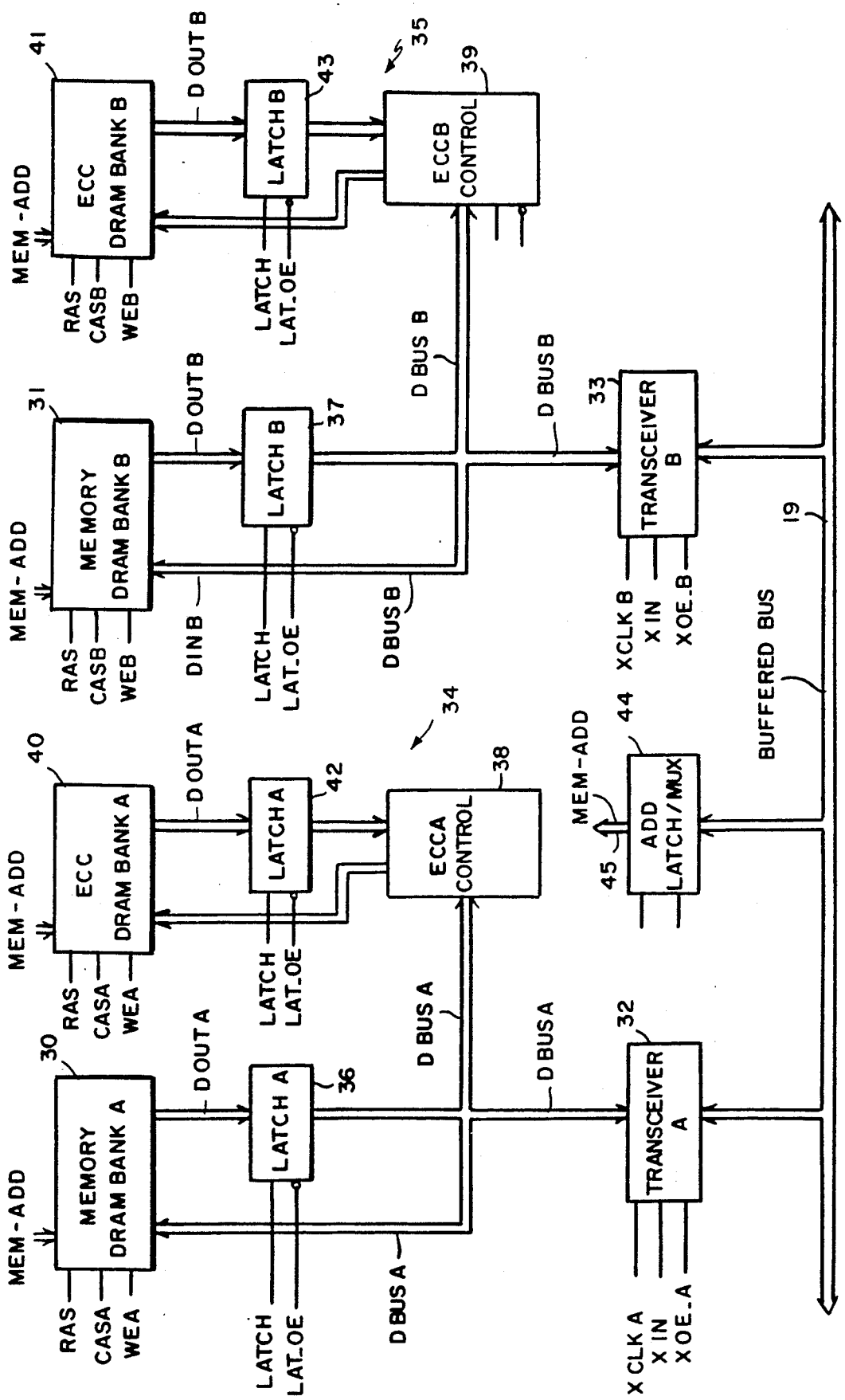
FIG. 2 shows a block diagram of a memory system in accordance with the invention.

FIG. 2 shows a block diagram of an exemplary memory system arrangement in accordance with the invention. As can be seen therein, the memory comprises two banks of memory modules in the form of dynamic random access memories (DRAM), as shown by DRAM memory banks 30 and 31, respectively, (identified as DRAM BANK A and DRAM BANK B) Addresses and data to be tranferred into each memory bank are supplied at suitable input ports thereof and data to be accessed therefrom is supplied at suitable output ports thereof. Addresses and data words are carried on buffered bus 19 and are tranferred to and from memory banks 30 and 31 via interface units comprising address latch/multiplexer (MUX) unit 44 for addresses and transceiver register latch units 32 and 33 for data words, respectively. Data from the output ports of the memory banks can be supplied to transceivers 32 and 33 and to associated error detection and correction (ECC) logic 34 and 35 via latches 36 and 37, respectively. ECC logic includes suitable control logic 38 and 39, respectively, and appropriate dynamic random access memories identified as ECC DRAMS 40 and 41, respectively. Access to ECC DRAM banks 40 and 41 is obtained via suitable input ports and output ports for each memory bank in the ECC logic. The error checking data, e.g., Hamming code data, from the output ports thereof is supplied via latches 42 and 43, respectively.

Various pertinent control signals shown for operating the units in FIG. 2 are supplied from memory control logic 25 operating in accordance with the timing diagrams as discussed below.

The read and write operations thereof can be described in connection with the timing diagrams shown in FIG. 3 (Data Block Write) and FIG. 4 (Data Block Read), respectively. The discussion of such operations in connection with such timing diagrams describes the system operation in accordance with the interleaved and, in the case of a read operation, the pipelined technique of the invention for an exemplary four word data block transfer.

Figure 3:
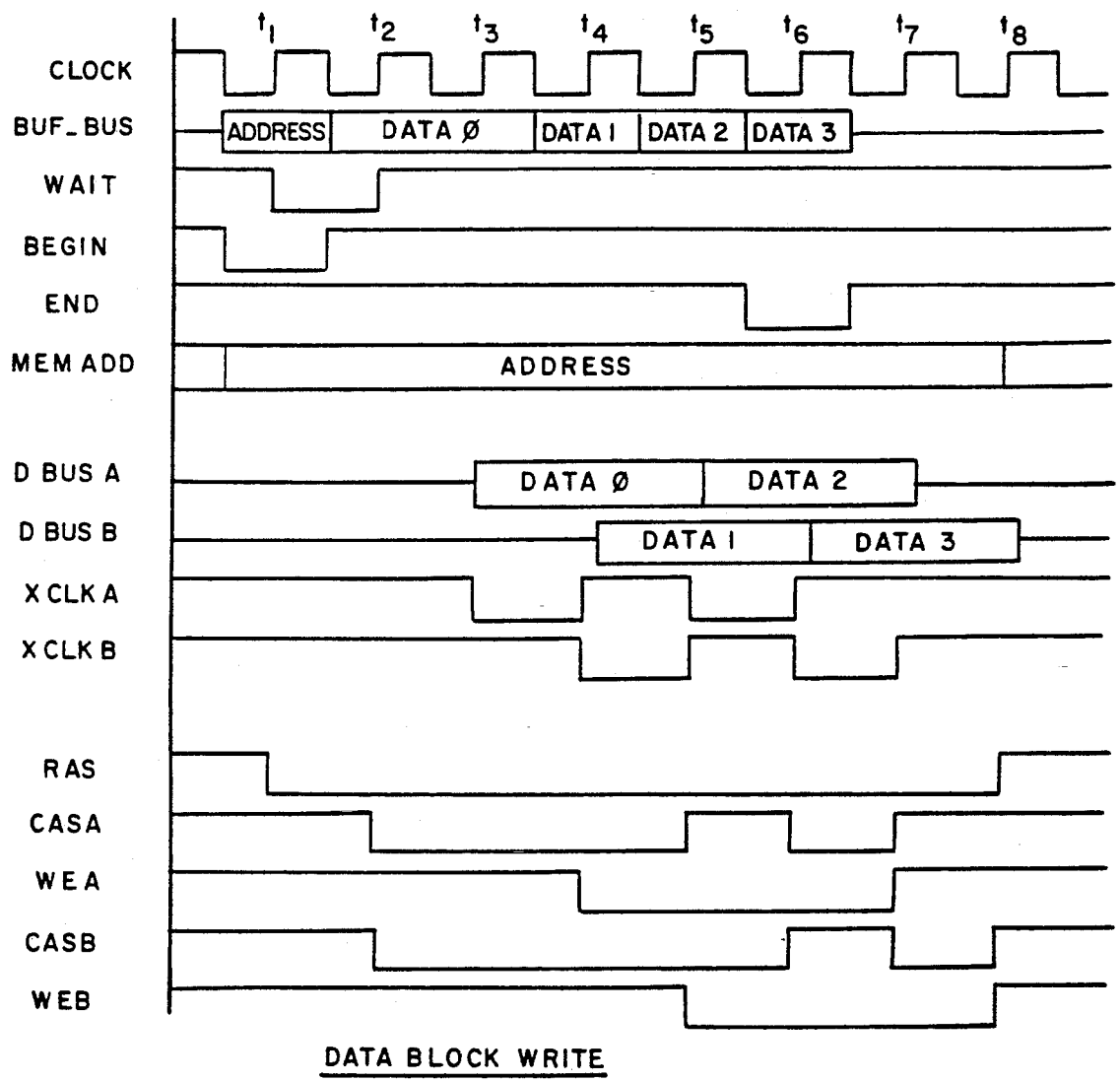
FIG. 3 shows a timing diagram for a typical write operation used for the memory system of FIG. 2.

As can be seen in FIG. 3, $t_1$, $t_2$, $t_3$ ... are defined as the up count pulses of each operating time cycle of a clock signal on which appropriate control signals in the system are normally enabled. In FIG. 3, for a write operation, the address of the initial word of a four-word data block which is to be written into memory flows through address latch/MUX unit 44 to the memory's internal MEM—ADD bus 45. After BEGIN is asserted by a device requiring a write to the memory to start the write operation, the address of the first data word of a sequence thereof (e.g. a four word data block) is latched from buffered bus 19 to the MEM—ADD bus 45 at $t_1$. At $t_1$, the row address strobe signal RAS is asserted and supplied to both DRAM Bank A and DRAM Bank B, the address being latched through the address latch/MUX unit 44 onto MEM—ADD bus 45 thereby being available for use at the memory banks at the assertion of RAS and subsequently at the assertion of the CAS signals therefor, as is well-known for DRAM operation. A WAIT signal is also asserted at $t_1$ for one cycle in accordance with the speed of operation of the DRAMs (the ECC circuitry requires that data cannot be written until ECC has generated the required Hamming code).

At $t_2$ the column address signals, CASA and CASB, to each DRAM are asserted, the WAIT signal being de-asserted. The first data word DATA $\phi$ which has been available on the buffered bus subsequent to the address of the initial word is clocked to DRAM A by asserting XCLK A to transceiver 32. This latched data word is enabled on to DBUS A when XOE—A is low. DATA $\phi$ is also supplied to ECC circuitry 34 which generates the Hamming code bits therefor, as would be known to the art, for storage in ECC DRAM 40 via its input port.

At $t_4$ the write enable signal (WEA) for DRAM A and ECC DRAM A is asserted to write DATA $\phi$ into DRAM Bank 30 and its Hamming code into ECC DRAM bank 40. Simultaneously, data word DATA 1 is clocked onto DBUS B from the buffered bus by the assertion of XCLKB, via transceiver 33 which is enabled when XOE—B is low. DATA 1 is also supplied to ECC circuitry 35 for the generation of its Hamming code. At $t_5$ the write enable signal (WEB) for DRAM B and ECC DRAM B is asserted in order to write DATA 1 and its Hamming code into DRAM 31 and DRAM 41, respectively. Thus, late writes of DATA $\phi$ and DATA 1 to memory banks A and B, respectively, are performed. Subsequently early writes are performed for DATA 2 and DATA 3; WEA and WEB are held low, while CASA and CASB are toggled. As is known to the art in a DRAM late write operation, the write enable signal is asserted after the CAS signal to write a word into a DRAM, while in an early write operation the CAS signal is asserted after the write enable signal to write a word into a DRAM. Data word DATA 2 is clocked onto DBUS A on the re-assertion of XCLK A from the buffered bus via transceiver system 32.

At $t_6$ CASA is re-asserted and DATA 2 and its Hamming code are written into DRAM A and ECC DRAM A, WEA having remained asserted. Data word DATA 3 is clocked onto DBUS B from the buffered bus via tranceiver 33 at the re-assertion of XCLK B and CASB is de-asserted. At $t_7$ DATA 3 and its Hamming code are written into DRAM B and ECC DRAM B by re-asserting CASB, WEB having remained asserted. WEA is de-asserted and at $t_8$, WEB and RAS are de-asserted since this particular typical operation is for a four word block write.

Thus, the four data words (DATA 0-3) are sequentially written in an interleaved fashion into DRAM memory banks 30 and 31, the latches 36, 37, 42 and 43 all remaining disabled for a write operation (LAT_OE is high for each). For DRAM's of the nibble-mode type, up to 8 sequential words (e.g., two 4-word data blocks or one 8-word data block) can be so written in the same interleaved fashion, i.e., alternating words in each DRAM, respectively, through the use of late writes followed by early writes to each bank. If static-column (sometimes referred to as fast page) DRAM's are used, a greatly extended block, or sequence, of data words can be so written in such alternating interleaved fashion. A suitable address counter can be used in conjunction with address latch/MUX 44 so as to keep track of each column address for subsequent data words of the total block thereof.

Figure 4:
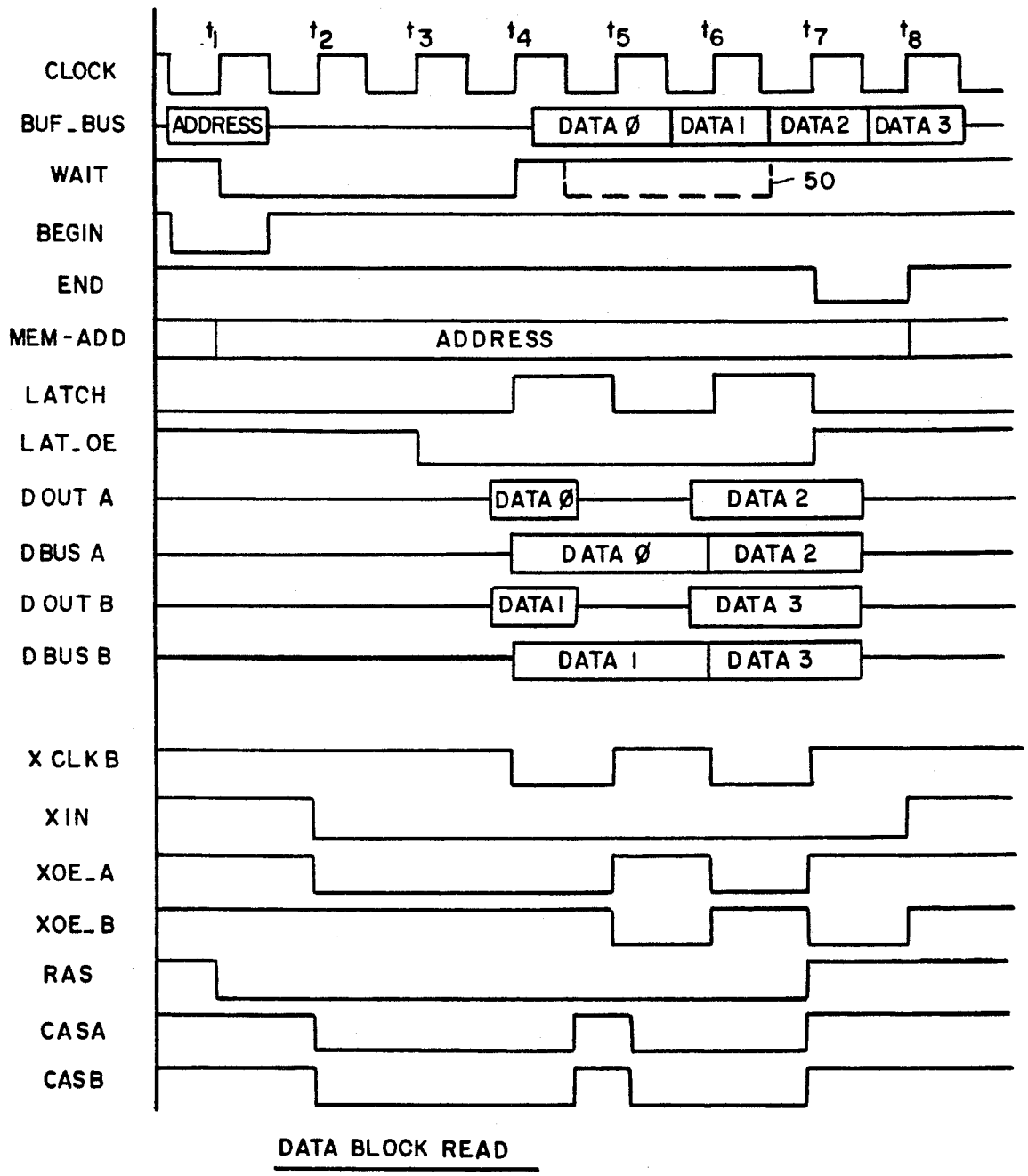
FIG. 4 shows a timing diagram for a typical read operation used for the memory system of FIG. 2.

FIG. 4 shows a timing diagram for a normal read operation (as exemplified for a read cycle for a four word data block), wherein four data words (DATA 0-3) are to be read from DRAM banks A and B in an interleaved fashion as discussed above. Reads from both memory banks are performed in parallel to reduce the complexity of the memory control logic needed, and an extra stage of pipelining is added on DBUS B to supply data to the buffered bus alternately from memory banks A and B, respectively. Since in the read operation each word must be checked for errors, data words for a read operation are supplied to buffered bus 19 in a pipelined manner using appropriate control signals for the operations of transceivers 32 and 33. As can be seen in the timing diagram of FIG. 4, when BEGIN is asserted the initial address of the four word block which is to be read is on buffered bus 19 and is latched into address latch/MUX 44 and supplied to MEM_ADD 45 bus for DRAM banks A and B and at $t_1$ the RAS signal is asserted to both DRAM banks A and B. The WAIT signal is asserted for three cycles in accordance with the speed of operation required for a read operation for the DRAM's.

At $t_2$, the CASA and CASB signals are asserted to the DRAM banks A and B, respectively, while WAIT continues to be asserted. XIN is driven low so that transceivers 32 and 32 can take data from DBUS A and DBUS B, respectively, for putting on the buffered bus 19. XOE_A is asserted only at transceiver register 32 to make such transceiver transparent.

At $t_3$, the LAT OE signal enabales latches 36, 37, 42 and 43 to make them transparent. Before $t_4$ data is valid at the output ports of DRAMS 30 and 31 (i.e., the data words DATA $\phi$ and DATA 1, respectively) and flows through to DBUS A and DBUS B because latches 36 and 37 are transparent. At $t_4$ the WAIT signal is de-asserted and LATCH is asserted at latches 36, 37, 42 and 43. Because LAT_OE remains asserted to each such latches, the valid data continues to be supplied through latches 36 and 37 to ECC circuitry 34 and 35, respectively, for the error detection and correction operation of the DATA $\phi$ and DATA 1 words. Transceiver 32 is transparent (XOE_A is asserted) so that DATA $\phi$ is simultaneously placed on the buffered bus while DATA 1 is latched into transceiver 33 by the assertion of XCLK B where it is held because XOE B is not yet asserted.

At the next down count following $t_4$ the CASA and CASB signals are de-asserted for one-half clock cycle until re-assertion thereof at $t_5$ at which time the next set of two data words (DATA 2 and DATA 3) are read. In the absence of the assertion of a WAIT signal (which is asserted after $t_4$ only if an error is detected in DATA $\phi$ or DATA 1), as discussed below, DATA $\phi$ which is on the buffered bus can be accepted by the requestor who is performing the read operation after which transceiver 32 is disabled (XOE_A is de-asserted). Transceiver 33 is enabled (XOE_B is asserted) and DATA 1 which had been latched therein is thereupon placed on the buffered bus. Simultaneously, latches 36, 37, 42 and 43 are made transparent (LATCH is de-asserted) allowing DATA 2 and DATA 3 to flow through to DBUS A and DBUS B, respectively. If errors are detected in DATA $\phi$ and/or DATA 1, a WAIT is asserted (see dashed line 50) for two cycles for error correction and all subsequent operations are delayed by two cycles.

Assuming no errors in DATA $\phi$ or DATA 1 are detected and must be corrected, at $t_6$ data words DATA 2 and DATA 3 are available at the output ports of DRAM A and DRAM B, respectively, and are latched into latches 36 and 37 to DBUS A and DBUS B, respectively. DATA 2 and DATA 3 are supplied via latches 36 and 37 to ECC circuitry 34 and 35, respectively, for error detection. If an error is detected in DATA 2 and/or DATA 3, a WAIT is assered for correction thereof, as above. If no error is detected, DATA 2 is driven to the buffered bus at $t_6$ and can be accepted by the requestor, while DATA 3 is latched into transceiver 33 but held there since XOE_B is de-asserted.

At $t_7$, the RAS, CASA and CASB signals are de-asserted. If no WAIT is asserted (because of a detected error in DATA 2 or DATA 3), DATA 2 can be accepted by the requestor and transceiver 32 is disabled (XOE_A is de-asserted). Transceiver 33 is enabled (XOE_B is asserted) and, assuming no WAIT signal (for an error in DATA 2 or DATA 3) at $t_8$, DATA 3 in transceiver 33 is supplied to the buffered bus. DATA 3 can be accepted by the requestor and the four word data block read transfer operation is completed.

The above process can be continued for four more data words, e.g. for a second 4-word data block or for an overall 8-word data block read operation using nibble-mode DRAM's. Alternatively, if static column DRAM's are used an extended number of words can be read in an alternately interleaved manner and supplied in a pipelined fashion to the bus, an appropriate address counter being used for identifying the column addresses of subsequent data words so that the sequence thereof can be effectively tracked by the system.

What is claimed is:
1. A memory system for use in a data processing system comprising
two memory banks for storing data words;

an error detection and correction means associated with each of said memory banks;

means for writing into one of said memory banks, alternating data words of a multi-word data block, and for writing into the other of said memory banks intervening alternating data words of said multi-word data block;

means for performing a transfer of said multi-words in a data block thereof so that said data words can be written into said two memory banks in a selected, interleaved sequence; and means for reading a multi-word data block from said memory banks in a pipelined manner such that, with respect to each successive pair of data words of said data block, the data words of each pair are read simultaneously from said memory banks and the data word read from said one memory bank is then made available for a requestor while the data word read form said other memory bank is held prior to being made available for a requestor, the data words when simultaneously read from said memory banks being supplied to the error detecting and correcting means associated with each said memory bank, respectively.

2. A memory system in accordance with claim 1 wherein a first data word written into each said memory bank is written using a late write operation and each subsequent data word written into each said memory bank is written using an early write operation.

3. A memory system in accordance with claim 1 and further wherein, if an error is detected in any data word during a read operation, the read operation is delayed by a selected time period until said error is corrected, said read operation resuming after said selected time period.

4. A memory system in accordance with claims 2 or 3 wherein said data block comprises four data words, DATA $\phi$-3, data words DATA $\phi$ and DATA 2 being written into or read from said one memory bank and data words DATA 1 and DATA 3 being written into or read from said other memory bank.

5. A memory system in accordance with claims 2 or 4 wherein said data block comprises eight data words, DATA $\phi$-7, data words DATA o, DATA 2, DATA 4, DATA 6 being written into or read form said one memory bank and data words DATA 1, DATA 3, DATA 5, and DATA 7 being written into or read from said other memory bank.

6. A method for writing a block of multiple data words into or reading a block of multiple data words from two memory banks comprising the steps of
1) when writing a block of data words
   writing into one of said memory banks, alternating data words of said block thereof; and
   writing into the other of said memory banks, intervening alternating data words of said block thereof;
   whereby said data words are written into said memory banks in an interleaved sequence thereof; and
2) when reading a block of data words
   reading pairs of data words simultaneously, one from each memory bank;
   checking the data words of each of said pair thereof for errors when read;
   supplying the data words of each pair read from one of said memory banks immediately; and
   retaining the data word of each pair read from the other of said memory banks for supplying said data word after the data word from said one memory bank has been supplied.

7. A method in accordance with claim 6, the writing into said memory banks comprises
   writing the first data word of a block thereof into a memory bank using a late write operation; and
   writing each subsequent word of said block thereof into a memory bank using an early write operation.

8. A method in accordance with claim 6 and further comprising
   delaying the reading of data words from said memory banks by a selected time period when an error has been detected on a data word to permit said error to be corrected.

* * * * *